United States Patent
Zhang et al.

(10) Patent No.: US 10,541,039 B2
(45) Date of Patent: Jan. 21, 2020

(54) SHIFT REGISTER CIRCUIT, DRIVING METHOD THEREOF, GATE DRIVE CIRCUIT, DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD, Hefei, Anhui (CN)

(72) Inventors: Yang Zhang, Beijing (CN); Jinliang Liu, Beijing (CN); Mo Chen, Beijing (CN); Jian Zhao, Beijing (CN); Jilei Gao, Beijing (CN); Songmei Sun, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei Anhui (CN)

( * ) Notice: Subject to any disclaimer, the term of this patent is extended or adjusted under 35 U.S.C. 154(b) by 92 days.

(21) Appl. No.: 15/768,487

(22) PCT Filed: Sep. 26, 2017

(86) PCT No.: PCT/CN2017/103352
§ 371 (c)(1),
(2) Date: Apr. 13, 2018

(87) PCT Pub. No.: WO2018/126741
PCT Pub. Date: Jul. 12, 2018

(65) Prior Publication Data
US 2019/0080779 A1     Mar. 14, 2019

(30) Foreign Application Priority Data

Jan. 5, 2017 (CN) .......................... 2017 1 0008154

(51) Int. Cl.
*G11C 19/28* (2006.01)
*G09G 3/20* (2006.01)

(52) U.S. Cl.
CPC ............. *G11C 19/287* (2013.01); *G09G 3/20* (2013.01); *G09G 2300/0426* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| 5,426,383 A * | 6/1995 | Kumar | H03K 19/09441 |
| | | | 326/119 |
| 2008/0080661 A1* | 4/2008 | Tobita | G11C 19/28 |
| | | | 377/78 |

(Continued)

FOREIGN PATENT DOCUMENTS

| CN | 104934011 A | 9/2015 |
| CN | 104992661 A | 10/2015 |

(Continued)

OTHER PUBLICATIONS

International Search Report and Written Opinion received for PCT Patent Application No. PCT/CN2017/103352, dated Dec. 27, 2017, 14 pages (2 pages of English Translation of Written Opinion Only).

*Primary Examiner* — Duane N Taylor, Jr.
(74) *Attorney, Agent, or Firm* — Womble Bond Dickinson (US) LLP (57) ABSTRACT

A shift register circuit includes a set circuit, a first reset circuit, a first control circuit, and an output circuit. The output circuit is configured to change an active potential at the first node further away from an inactive potential in response to a first clock signal transferred to a signal output terminal being active, and the first control circuit is further (Continued)

configured to, responsive to the first clock signal transferred to the signal output terminal being active, restrict a change in the active potential at the first node based on a second reference voltage from a second reference voltage, the second reference voltage having a magnitude between an active input pulse and the inactive potential.

20 Claims, 5 Drawing Sheets

(56) References Cited

U.S. PATENT DOCUMENTS

| | | |
|---|---|---|
| 2016/0055814 A1* | 2/2016 | Yang .................... G09G 3/3677 345/213 |
| 2017/0032752 A1 | 2/2017 | Huang et al. |
| 2017/0076680 A1 | 3/2017 | Li et al. |
| 2017/0193888 A1* | 7/2017 | Moon ....................... G09G 3/20 |
| 2017/0193945 A1 | 7/2017 | Feng |

FOREIGN PATENT DOCUMENTS

| | | |
|---|---|---|
| CN | 105047172 A | 11/2015 |
| CN | 106683607 A | 5/2017 |
| KR | 10-2012-0044677 A | 5/2012 |

* cited by examiner

SHIFT REGISTER CIRCUIT, DRIVING METHOD THEREOF, GATE DRIVE CIRCUIT, DISPLAY PANEL AND DISPLAY DEVICE

CROSS REFERENCE TO RELATED APPLICATIONS

This application is the U.S. national phase entry of PCT/CN2017/103352, filed on Sep. 26, 2017, which PCT application claims the benefit of China Patent Application No. 201710008154.9, filed on Jan. 5, 2017, the entire disclosures of which are incorporated herein by reference.

TECHNICAL FIELD

The present disclosure relates to the field of display technology, and particularly to a shift register circuit, a driving method thereof, a gate drive circuit, a display panel and a display device.

BACKGROUND

The shift register may operate as a gate drive circuit of a display device to sequentially supply the gate lines with a gate scan signal to turn on the transistors in each row of pixels to allow writing of a data signal to each pixel.

In order to fully turn on the transistors, the high level of the gate scan signal generally needs to reach 25 V or more. Due to the self-boosting effect of the storage capacitor in the shift register, the potential at some internal nodes of the shift register may be even higher, e.g., more than double the high level of the gate scan signal (above 50 V). Such a high potential results in a large change in the characteristics of the transistors connected to these internal nodes, producing threshold voltage drift. If the display device operates under such conditions for a long time, the shift register becomes unstable, thus yielding degraded gate scanning signals.

SUMMARY

It would be advantageous to provide a shift register circuit that may alleviate, mitigate or eliminate one or more of the above problems.

According to an aspect of the present disclosure, a shift register circuit is provided comprising a set circuit configured to, responsive to an input pulse from a signal input terminal being active, transfer the input pulse to a first node to set the first node at an active potential; a first reset circuit configured to transfer a first reference voltage from a first reference voltage terminal to the first node to set the first node at an inactive potential in response to a reset pulse from a reset signal terminal being active, and to transfer the first reference voltage from the first reference voltage terminal to a signal output terminal in response to the reset pulse from the reset signal terminal being active; an output circuit configured to transfer a first clock signal from a first clock signal terminal to the signal output terminal in response to the first node being at the active potential, and to change the active potential at the first node further away from the inactive potential in response to the first clock signal transferred to the signal output terminal being active; and a first control circuit configured to maintain the first node at the active potential in response to the input pulse from the signal input terminal being active, and to restrict a change in the active potential at the first node based on a second reference voltage from a second reference voltage terminal in response to the first clock signal transferred to the signal output terminal being active, the second reference voltage having a magnitude between a magnitude of the active input pulse and the inactive potential.

In some embodiments, the first control circuit comprises a first transistor having a gate and a first electrode that are connected to the signal input terminal, and a second electrode connected to a second node; a second transistor having a gate connected to the signal output terminal, a first electrode connected to the second reference voltage terminal, and a second electrode connected to the second node; and a first capacitor connected between the second node and the first node.

In some embodiments, the output circuit comprises a third transistor having a gate connected to the first node, a first electrode connected to the first clock signal terminal, and a second electrode connected to the signal output terminal; and a second capacitor connected between the first node and the signal output terminal.

In some embodiments, the first reset circuit comprises a fourth transistor having a gate connected to the reset signal terminal, a first electrode connected to the first reference voltage terminal, and a second electrode connected to the signal output terminal; and a seventh transistor having a gate connected to the reset signal terminal, a first electrode connected to the first reference voltage terminal, and a second electrode connected to the first node.

In some embodiments, the set circuit comprises a sixth transistor having a gate and a first electrode that are connected to the signal input terminal, and a second electrode connected to the first node.

In some embodiments, the shift register circuit further comprises a second control circuit configured to transfer the first reference voltage from the first reference voltage terminal to a third node to set the third node at an inactive potential in response to the first node being at the active potential, and to transfer a second clock signal from a second clock signal terminal to the third node to set the third node at an active potential in response to the second clock signal being active and the first node being at the inactive potential; and a second reset circuit configured to transfer the first reference voltage from the first reference voltage terminal to the first node to set the first node at an inactive potential in response to the third node being at the active potential, and to transfer the first reference voltage from the first reference voltage terminal to the signal output terminal in response to the third node being at the active potential.

In some embodiments, the second control circuit comprises a ninth transistor having a gate and a first electrode that are connected to the second clock signal terminal, and a second electrode; a tenth transistor having a gate connected to the second electrode of the ninth transistor, a first electrode connected to the second clock signal terminal, and a second electrode connected to the third node; an eleventh transistor having a gate connected to the first node, a first electrode connected to the first reference voltage terminal, and a second electrode connected to the second electrode of the ninth transistor; and a twelfth transistor having a gate connected to the first node, a first electrode connected to the first reference voltage terminal, and a second electrode connected to the third node.

In some embodiments, the second reset circuit comprises a fifth transistor having a gate connected to the third node, a first electrode connected to the first reference voltage terminal, and a second electrode connected to the signal output terminal; and an eighth transistor having a gate connected to the third node, a first electrode connected to the first reference voltage terminal, and a second electrode connected to the first node.

According to another aspect of the present disclosure, a gate drive circuit is provided comprising a plurality of cascaded shift register circuits as described above. Except for a first one of the shift register circuits and a last one of the shift register circuits, the signal output terminal of each of the shift register circuits is connected to both the signal input terminal of an adjacent next one of the shift register circuits and the reset signal terminal of an adjacent previous one of the shift register circuits. The signal output terminal of the first shift register circuit is connected to the signal input terminal of a second one of the stage shift register circuits. The signal output terminal of the last shift register circuit is connected to the reset signal terminal of an adjacent previous one of the shift register circuits.

According to yet another aspect of the present disclosure, a display panel is provided comprising the gate drive circuit as described above.

According to still yet another aspect of the present disclosure, a display device is provided comprising the display panel as described above.

According to a further aspect of the present disclosure, a method of driving the shift register circuit as described above is provided. The method comprises: in a first phase, responsive to the input pulse from the signal input terminal being active, transferring the input pulse to the first node to set the first node at the active potential, and responsive to the first node being at the active potential, transferring the first clock signal from the first clock signal terminal to the signal output terminal; in a second phase, responsive to the first clock signal transferred to the signal output terminal being active, changing the active potential at the first node further away from the inactive potential, and responsive to the first clock signal transferred to the signal output terminal being active, restricting a change in the active potential at the first node based on the second reference voltage from the second reference voltage terminal, the second reference voltage having a magnitude between a magnitude of the active input pulse and the inactive potential; and in a third phase, responsive to the reset pulse from the reset signal terminal being active, transferring the first reference voltage from the first reference voltage terminal to the first node to set the first node at an inactive potential, and responsive to the reset pulse from the reset signal terminal being active, transferring the first reference voltage from the first reference voltage terminal to the signal output terminal.

In some embodiments, the method further comprises: in the first and second phases, responsive to the first node being at the active potential, transferring the first reference voltage from the first reference voltage terminal to a third node to set the third node at an inactive potential; and in the third phase, responsive to a second clock signal from a second clock signal terminal being active and the first node being at the inactive potential, transferring the second clock signal to the third node to set the third node at an active potential.

In some embodiments, the method further comprises: in the third stage, responsive to the third node being at the active potential, transferring the first reference voltage from the first reference voltage terminal to the first node to set the first node at an inactive potential, and responsive to the third node being at the active potential, transferring the first reference voltage from the first reference voltage terminal to the signal output terminal.

These and other aspects of the present disclosure will be apparent from and elucidated with reference to the embodiment(s) described hereinafter.

DETAILED DESCRIPTION

It will be understood that, although the terms first, second, third etc. may be used herein to describe various elements, components and/or sections, these elements, components and/or sections should not be limited by these terms. These terms are only used to distinguish one element, component or section from another. Thus, a first element, component or section discussed below could be termed a second element, component or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to" or "coupled to" another element, it can be directly connected or coupled to the other element or layer, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure are described in detail below with reference to the accompanying drawings.

Figure 1:
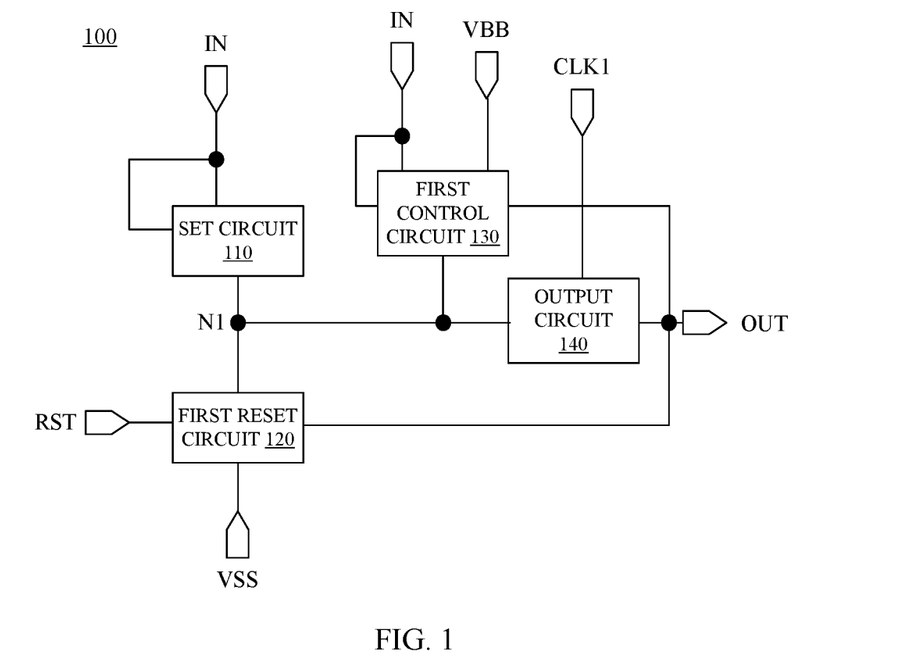
FIG. 1 is a block diagram of a shift register circuit according to an embodiment of the present disclosure.

FIG. 1 is a block diagram of a shift register circuit 100 in accordance with an embodiment of the present disclosure.

Referring to FIG. 1, the shift register circuit 100 includes a set circuit 110, a first reset circuit 120, a first control circuit 130, and an output circuit 140.

The set circuit 110 is connected to a signal input terminal IN and a first node N1. The set circuit 110 is configured to, responsive to the input pulse being active, transfer an input pulse from the signal input terminal IN to the first node N1 to set the first node N1 at an active potential.

The first reset circuit 120 is connected to a reset signal terminal RST, a first reference voltage terminal VSS, the first node N1, and a signal output terminal OUT. The first reset circuit 120 is configured to, responsive to a reset pulse from the reset signal terminal RST being active, transfer a first reference voltage from the first reference voltage terminal VSS to the first node N1 to set the first node N1 at an inactive potential. The first reset circuit 120 is also configured to transfer the first reference voltage from the first reference voltage terminal VSS to the signal output terminal OUT in responsive to the reset pulse from the reset signal terminal RST being active.

The output circuit 140 is connected to the first node N1, a first clock signal terminal CLK1 and the signal output terminal OUT. The output circuit 140 is configured to transfer a first clock signal from the first clock signal terminal CLK1 to the signal output terminal OUT in response to the first node N1 being at an active potential. The output circuit 140 is also configured to change the active potential at the first node N1 further away from the inactive potential in response to the first clock signal transferred to the signal output terminal OUT being active.

The first control circuit 130 is connected to the signal input terminal IN, a second reference voltage terminal VBB, and the first node N1. The first control circuit 130 is configured to maintain the first node N1 at an active potential in response to the input pulse from the signal input terminal IN being active. The first control circuit 130 is also configured to, responsive to the first clock signal transferred to the signal output terminal OUT being active, restrict a change in the active potential at the first node N1 based on a second reference voltage from the second reference voltage terminal VBB. As will be described below, the second reference voltage has a magnitude between a magnitude of the active input pulse and the inactive potential.

The term "active potential" as used herein refers to a potential at which the circuit element(s) (e.g., a transistor) involved is/are enabled. Similarly, the term "active signal" refers to a signal that has an active potential to enable the circuit element(s) involved. In contrast, the term "inactive potential" refers to a potential at which the circuit element(s) involved is/are disabled.

In this embodiment, the potential at the first node N1 may be limited by the first control circuit 130 to alleviate or eliminate the problem caused by an excessive potential at the first node N1, such as a change in the operation characteristics of the circuit element(s) involved, the instability of the output signal of the shift register circuit 100, and the like.

Figure 2:
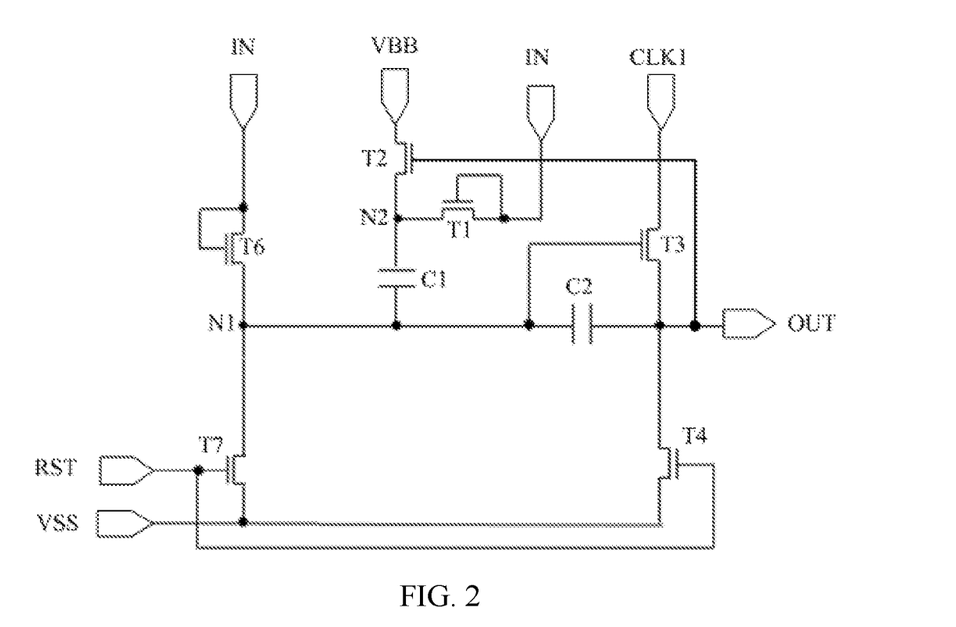
FIG. 2 is an exemplary circuit diagram of the shift register circuit shown in FIG. 1.

FIG. 2 is an exemplary circuit diagram of the shift register circuit 100 shown in FIG. 1. This example circuit is described below with reference to FIGS. 1 and 2.

The set circuit 110 includes a sixth transistor T6 having a gate and a first electrode that are both connected to the signal input terminal IN, and a second electrode connected to the first node N1.

The first reset circuit 120 includes a fourth transistor T4 and a seventh transistor T7. The fourth transistor T4 has a gate connected to the reset signal terminal RST, a first electrode connected to the first reference voltage terminal VSS, and a second electrode connected to the signal output terminal OUT. The seventh transistor T7 has a gate connected to the reset signal terminal RST, a first electrode connected to the first reference voltage terminal VSS, and a second electrode connected to the first node N1.

The first control circuit 130 includes a first transistor T1, a second transistor T2, and a first capacitor C1. The first transistor T1 has a gate and a first electrode that are both connected to the signal input terminal IN, and a second electrode connected to the second node N2. The second transistor T2 has a gate connected to the signal output terminal IN, a first electrode connected to the second reference voltage terminal VBB, and a second electrode connected to the second node N2. The first capacitor C1 is connected between the second node N2 and the first node N1.

The output circuit 140 includes a third transistor T3 and a second capacitor C2. The third transistor T3 has a gate connected to the first node N1, a first electrode connected to the first clock signal terminal CLK1, and a second electrode connected to the signal output terminal OUT. The second capacitor C2 is connected between the first node N1 and the signal output terminal OUT.

In this example circuit, the second reference voltage from the second reference voltage terminal VBB has a magnitude smaller than a magnitude of the active input pulse from the signal input IN and greater than the inactive potential, i.e., a magnitude between the active input pulse and the inactive potential. This may prevent the potential at the first node N1 from being pulled up too high due to a self-boosting effect of the second capacitor when the shift register circuit 100 is operating. This attributes to the following operation process. The first clock signal from the first clock signal terminal CLK1 is transferred to the signal output terminal OUT through the third transistor T3 during a period in which the first node N1 is at an active potential (in this example, a high level). When the first clock signal transitions from an inactive potential (in this example, a low level) to the active potential, the second node N2 has been set at an active potential through the first transistor T1 by the active input pulse from the signal input terminal IN, and the potential at the first node N1 will be further pulled up due to the self-boosting effect of the second capacitor C2. At the same time, the second reference voltage from the second reference voltage terminal VBB is transferred to the second node N2 through the second transistor T2 so that the potential at the second node N2 is decreased by a certain amount (equal to the difference between a magnitude of the active input pulse and a magnitude of the second reference voltage). Due to a self-boosting effect of the first capacitor C1, the potential at the first node N1 will be pulled down. A trade-off between the self-boosting of the first capacitor C1 and the self-boosting of the second capacitor C2 results in the potential at the first node N1 being not increased by an amount that would otherwise have been without the first control circuit 130. In this manner, the potential at the internal node N1 of the shift register circuit 100 is restricted in operation.

Figure 3:
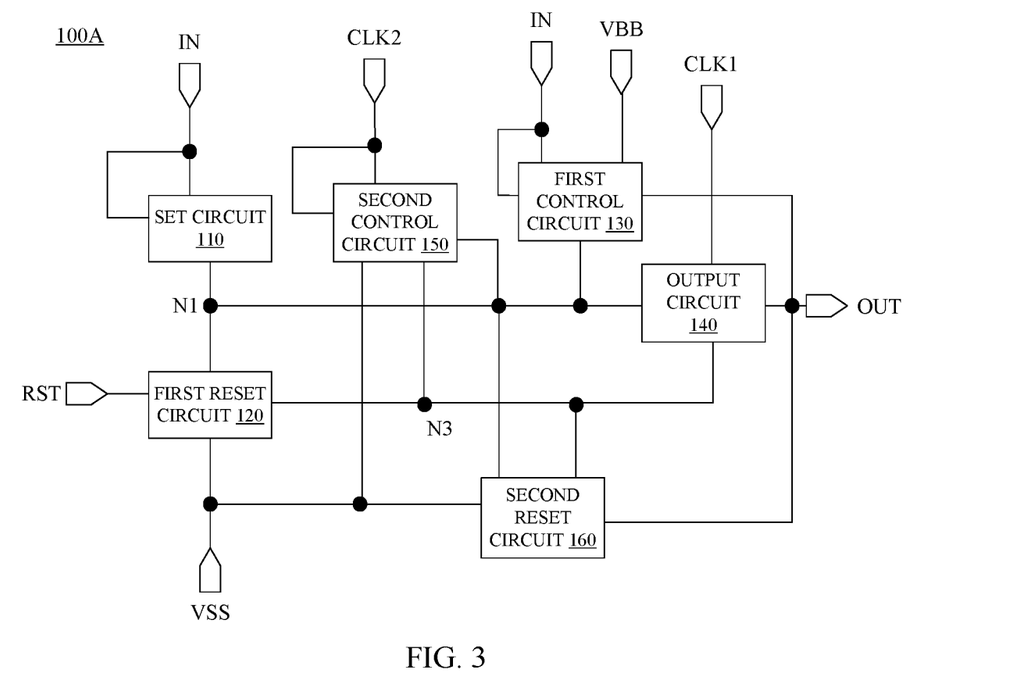
FIG. 3 is a block diagram of a shift register circuit according to an embodiment of the present disclosure.

FIG. 3 is a block diagram of a shift register circuit 100A according to an embodiment of the present disclosure. Referring to FIG. 3, compared with the shift register circuit 100 of FIG. 1, the shift register circuit 100A further includes a second control circuit 150 and a second reset circuit 160. The configurations of the set circuit 110, the first reset circuit 120, the first control circuit 130, and the output circuit 140 are the same as those described above with respect to FIGS. 1 and 2 and will not be repeated here.

The second control circuit 150 is connected to a second clock signal terminal CLK2, the first node N1, the third node N3, and the first reference voltage terminal VSS. The second control circuit 150 is configured to, responsive to the first node N1 being at the active potential, transfer the first reference voltage from the first reference voltage terminal VSS to the third node N3 to set the third node N3 at the inactive potential. The second control circuit 150 is further configured to, responsive to a second clock signal from the second clock signal terminal CLK2 being active and the first node N1 being at the inactive potential, transfer the second clock signal to the third node N3 to set the third node N3 at an active potential.

The second reset circuit 160 is connected to the first node N1, the third node N3, the signal output terminal OUT, and the first reference voltage terminal VSS. The second reset circuit 160 is configured to, responsive to the third node N3 being at the active potential, transfer the first reference voltage from the first reference voltage terminal VSS to the first node N1 to set the first node N1 at an inactive potential. The second reset circuit 160 is also configured to transfer the first reference voltage from the first reference voltage terminal VSS to the signal output terminal OUT in response to the third node N3 being at the active potential.

Figure 4:
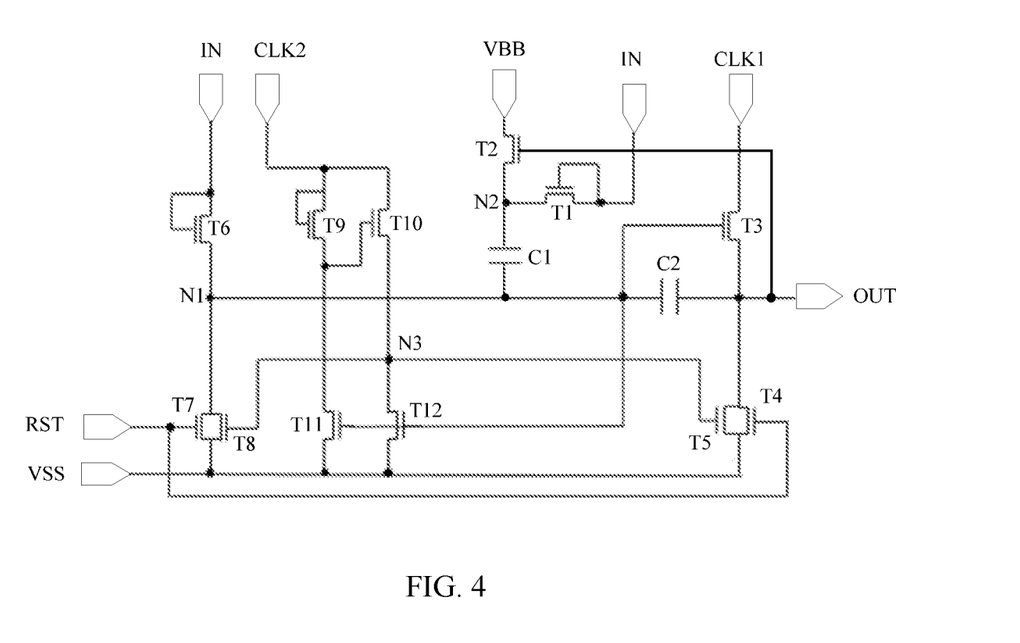
FIG. 4 is an exemplary circuit diagram of the shift register circuit shown in FIG. 3.

FIG. 4 is an exemplary circuit diagram of the shift register circuit 100A shown in FIG. 3. This example circuit is described below with reference to FIGS. 3 and 4. The configurations of the set circuit 110, the first reset circuit 120, the first control circuit 130, and the output circuit 140 are the same as those described above with reference to FIG. 2 and will not be repeated here.

The second control circuit 150 includes a ninth transistor T9, a tenth transistor T10, an eleventh transistor T11 and a twelfth transistor T12. The ninth transistor T9 has a gate and a first electrode that are both connected to the second clock signal terminal CLK2, and a second electrode. The tenth transistor T10 has a gate connected to the second electrode of the ninth transistor T9, a first electrode connected to the second clock signal terminal CLK2, and a second electrode connected to the third node N3. The eleventh transistor T11 has a gate connected to the first node N1, a first electrode connected to the first reference voltage terminal VSS, and a second electrode connected to the second electrode of the ninth transistor T9. The twelfth transistor T12 has a gate connected to the first node N1, a first electrode connected to the first reference voltage terminal VSS, and a second electrode connected to the third node N3.

The second reset circuit 160 includes a fifth transistor T5 and an eighth transistor T8. The fifth transistor T5 has a gate connected to the third node N3, a first electrode connected to the first reference voltage terminal VSS, and a second electrode connected to the signal output terminal OUT. The eighth transistor T8 has a gate connected to the third node N3, a first electrode connected to the first reference voltage terminal VSS, and a second electrode connected to the first node N1.

In various embodiments, the transistors are illustrated and described as N-type transistors, although P-type transistors are possible. In the case of P-type transistors, the gate-on voltage has a low level, and the gate-off voltage has a high level. In various embodiments, the transistors may be thin film transistors, which are typically fabricated such that their first and second electrodes are used interchangeably. Other embodiments are also contemplated.

As will be described below, the second control circuit 150 and the second reset circuit 160 operate to reset the first node N1 and the signal output terminal OUT more efficiently by setting the potential at the third node N3.

Figure 5:
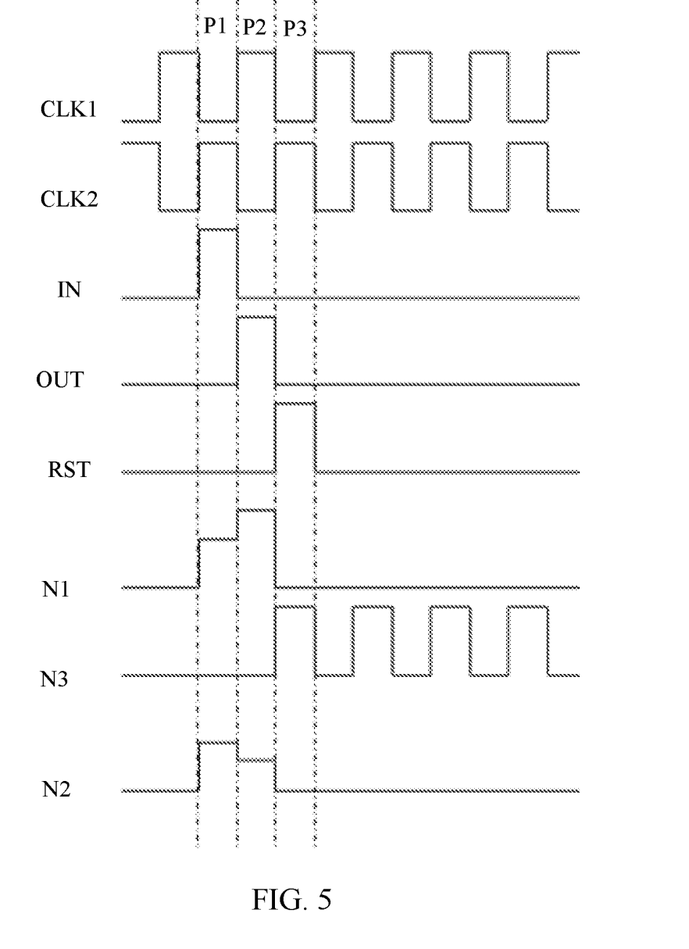
FIG. 5 is a timing diagram of the shift register circuit shown in FIG. 4.

FIG. 5 is a timing diagram of the shift register circuit shown in FIG. 4. The operation of this example shift register circuit is described below with reference to FIGS. 4 and 5. In the following, a high level is denoted by 1, and a low level by 0. It is also assumed that the high level of the first clock signal, the second clock signal, the input pulse, the reset pulse, and the output signal is VGH, the first reference voltage terminal VSS is supplied with a low level voltage, and the second reference voltage terminal VBB is supplied with a voltage having a magnitude of VGH/2.

In phase P1, IN=1, CLK2=1, CLK1=0, RST=0. Since IN=1 and CLK2=1, the sixth transistor T6, the ninth transistor T9 and the first transistor T1 are turned on. The turned-on first transistor T1 transfers an active input pulse from the signal input terminal IN to the second node N2 to set the second node at an active potential, and the turned-on sixth transistor T6 transfers the active input pulse from the signal input terminal IN to the first node N1 to set the first node at an active potential. The first capacitor C1 maintains the voltage between the first node N1 and the second node N2. The first node N1 is set at the active potential so that the third transistor T3, the eleventh transistor T11, and the twelfth transistor T12 are turned on. The turned-on third transistor T3 transfers the first clock signal from the first clock signal terminal CLK1 to the signal output terminal OUT. Since CLK1=0 at this stage, the signal output terminal OUT outputs a low level signal, so that the second transistor T2 is turned off. The turned-on ninth transistor T9 and the turned-on eleventh transistor T11 have a resistance divider effect, and the ninth transistor T9 and the eleventh transistor T11 are designed so that the equivalent resistance of the ninth transistor T9 is much larger than that of the eleventh transistor T11. Therefore, the gate voltage of the tenth transistor T10 is not sufficient to turn on the tenth transistor T10. As such, the turned-on twelfth transistor T12 transfers the first reference voltage from the first reference voltage terminal VSS to the third node N3 so that the third node N3 is set to an inactive potential.

In phase P2, IN=0, CLK2=0, CLK1=1, RST=0. Since IN=0 and CLK2=0, the sixth transistor T6, the ninth transistor T9 and the first transistor T1 are turned off. Since CLK1=1, the self-boosting effect of the second capacitor C2 causes the potential at the first node N1 to further increase, so that the third transistor T3, the eleventh transistor T11 and the twelfth transistor T12 are maintained in an on state. The turned-on third transistor T3 transfers the first clock signal from the first clock signal terminal CLK1 to the signal output terminal OUT. Since CLK1=1 at this stage, the signal output terminal OUT outputs a high level signal, so that the second transistor T2 is turned on. The turned-on second transistor T2 transfers the second reference voltage from the second reference voltage terminal VBB to the second node N2 such that the potential at the second node N2 drops from VGH to VGH/2. The self-boosting effect of the first capacitor C1 limits an increase in the potential at the first node N1 due to the self-boosting effect of the second capacitor C2, for example, allowing it to increase to only 1.5VGH instead of 2VGH. This avoids the problem arising from a too high potential at the first node N1, such as an unstable signal output from the signal output terminal OUT. In addition, the turned-on eleventh transistor T11 transfers the first reference voltage from the first reference voltage terminal VSS to the gate of the tenth transistor T10, thereby turning off the tenth transistor T10. The turned-on twelfth transistor T12 transfers the first reference voltage from the first reference voltage terminal VSS to the third node N3 so that the third node N3 is at an inactive potential.

In phase P3, IN=0, CLK2=1, CLK1=0, RST=1. Since CLK2=1 and RST=1, the fourth transistor T4, the seventh transistor T7, and the ninth transistor T9 are turned on. The turned-on fourth transistor T4 transfers the first reference voltage from the first reference voltage terminal VSS to the signal output terminal OUT, so that the signal output terminal OUT outputs a low level signal. The turned-on seventh transistor T7 transfers the first reference voltage from the first reference voltage terminal VSS to the first node N1 to set the first node N1 at an inactive potential. The turned-on ninth transistor T9 transfers the second clock signal from the second clock signal terminal CLK2 to the gate of the tenth transistor T10 so that the tenth transistor T10 is turned on. The turned-on tenth transistor T10 transfers the second clock signal from the second clock signal terminal CLK2 to the third node N3 to set the third node at the active potential, so that the fifth transistor T5 and the eighth transistor T8 are turned on. The turned-on fifth transistor T5 transfers the first reference voltage from the first reference voltage terminal VSS to the signal output terminal OUT, further ensuring that the signal output terminal OUT outputs the low level signal. The turned-on eighth transistor T8 transfers the first reference voltage from the first reference voltage terminal VSS to the first node N1, further ensuring that the first node N1 is reset to the inactive potential.

The phases P1-P3 may be repeated as a whole at regular intervals so that the shift register circuit 100A outputs a gate scanning signal at this interval via the signal output terminal OUT.

Figure 6:
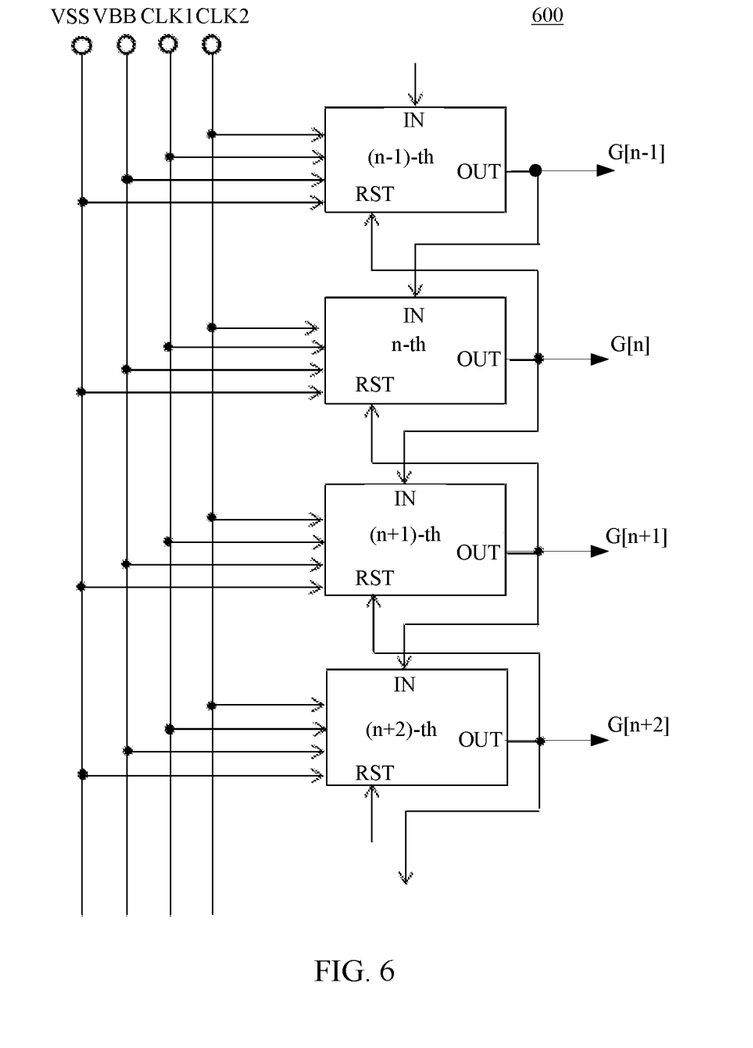
FIG. 6 is a block diagram of a gate drive circuit in accordance with an embodiment of the present disclosure.

FIG. 6 is a block diagram of a gate drive circuit 600 according to an embodiment of the present disclosure. Referring to FIG. 6, the gate drive circuit 600 includes a plurality of cascaded shift register circuits, each of which may be the shift register circuit 100 or 100A described above with respect to FIGS. 1 to 4.

Except for the first one of the shift register circuits and the last one of the shift register circuits, the signal output terminal OUT of each of the respective shift register circuits is connected to the signal input terminal IN of the adjacent next one of the shift register circuits and the reset signal terminal RST of the adjacent previous one of the shift register circuits. The signal output terminal OUT of the first shift register circuit is connected to the signal input terminal IN of the second stage shift register circuit. The signal output terminal OUT of the last shift register circuit is connected to the reset signal terminal RST of the adjacent previous shift register circuit.

For convenience of description, only four shift registers are shown in FIG. 6, that is, the (n−1)-th shift register, the n-th shift register, the (n+1)-th shift register and the (n+2)-th shift register that output gate scanning signals G[n−1], G[n], G[n+1], and G[n+2], respectively.

Figure 7:
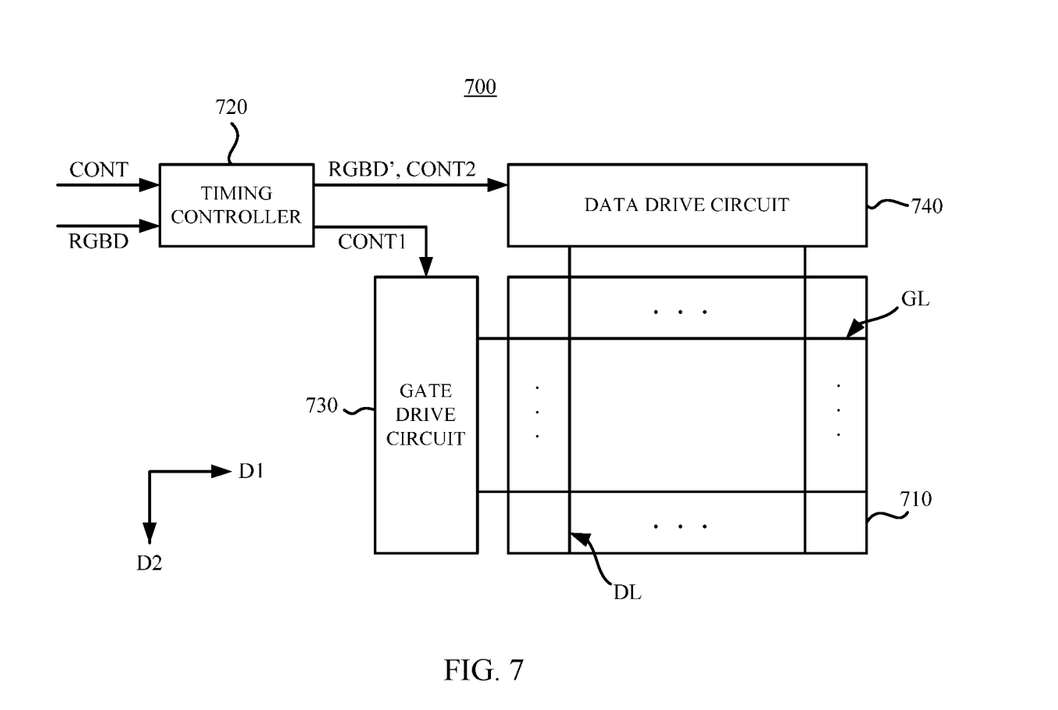
FIG. 7 is a block diagram of a display device according to an embodiment of the present disclosure.

FIG. 7 is a block diagram of a display device 700 according to an embodiment of the present disclosure. Referring to FIG. 7, the display device 700 includes a display panel 710, a timing controller 720, a gate drive circuit 730 and a data drive circuit 740. The gate drive circuit 730 may be the gate drive circuit 600 described above with respect to FIG. 6.

The display panel 710 is connected to a plurality of gate lines GL and a plurality of data lines DL. The display panel 710 displays an image having a plurality of grayscales based on output image data RGBD'. The gate lines GL may extend in a first direction D1 and the data lines DL may extend in a second direction D2 that intersects (e.g., is substantially perpendicular to) the first direction D1. The display panel 710 may include a plurality of pixels (not shown) arranged in a matrix. Each of the pixels may be electrically connected to a corresponding one of the gate lines GL and a corresponding one of the data lines DL. The display panel 710 may be a liquid crystal display panel, an organic light emitting diode (OLED) display panel, or other suitable type of display panel.

The timing controller 720 controls the operation of the display panel 710, the gate drive circuit 730, and the data drive circuit 740. The timing controller 720 receives input image data RGBD and input control signals CONT from an external device (for example, a host). The input image data RGBD may include a plurality of input pixel data for a plurality of pixels. Each input pixel data may include red, green, and blue grayscale data R, G, and B for a corresponding one of the plurality of pixels. The input control signals CONT may include a main clock signal, a data enable signal, a vertical synchronization signal, a horizontal synchronization signal, and the like. The timing controller 720 generates the output image data RGBD', a first control signal CONT1, and a second control signal CONT2 based on the input image data RGBD and the input control signals CONT.

The gate drive circuit 730 receives the first control signal CONT1 from the timing controller 720. The gate drive circuit 730 generates a plurality of gate signals for driving the gate lines GL based on the first control signals CONT1. The gate drive circuit 730 may sequentially apply the plurality of gate signals to the gate lines GL.

The data drive circuit 740 receives the second control signal CONT2 and the output image data RGBD' from the timing controller 720. The data drive circuit 740 generates a plurality of data voltages (e.g., analog data voltages) based on the second control signal CONT2 and the output image data RGBD' (e.g., digital image data). The data drive circuit 740 may apply the plurality of data voltages to the data lines DL.

In some exemplary embodiments, the gate drive circuit 730 and/or the data drive circuit 740 may be disposed (e.g., mounted directly) on the display panel 710 or may be connected to the display panel 710 by means of, for example, a Tape Carrier Package (TCP). In some embodiments, the gate drive circuit 730 and/or the data drive circuit 740 may be integrated in the display panel 710.

Examples of the display device 700 include, but are not limited to, a cell phone, a tablet, a television, a display, a notebook, a digital photo frame, a navigator.

It will be apparent for those skilled in the art to make various modifications and variations to the present disclosure without departing from the spirit and scope of the disclosure. Thus, if these modifications and variations of the disclosure fall within the scope of the appended claims and equivalent thereof, the disclosure is also intended to encompass these modifications and variations.

What is claimed is:

1. A shift register circuit comprising:
a set circuit configured to, responsive to an input pulse from a signal input terminal being active, transfer the input pulse to a first node to set the first node at an active potential;
a first reset circuit configured to transfer a first reference voltage from a first reference voltage terminal to the first node to set the first node at an inactive potential in response to a reset pulse from a reset signal terminal being active, and to transfer the first reference voltage from the first reference voltage terminal to a signal output terminal in response to the reset pulse from the reset signal terminal being active;

an output circuit configured to transfer a first clock signal from a first clock signal terminal to the signal output terminal in response to the first node being at the active potential, and to change the active potential at the first node further away from the inactive potential in response to the first clock signal transferred to the signal output terminal being active; and a first control circuit configured to maintain the first node at the active potential in response to the input pulse from the signal input terminal being active, and to restrict a change in the active potential at the first node based on a second reference voltage from a second reference voltage terminal in response to the first clock signal transferred to the signal output terminal being active, the second reference voltage having a magnitude between a magnitude of the active input pulse and the inactive potential.

2. The shift register circuit of claim 1, wherein the first control circuit comprises:

a first transistor having a gate and a first electrode that are connected to the signal input terminal, and a second electrode connected to a second node;

a second transistor having a gate connected to the signal output terminal, a first electrode connected to the second reference voltage terminal, and a second electrode connected to the second node; and a first capacitor connected between the second node and the first node.

3. The shift register circuit of claim 1, wherein the output circuit comprises:

a third transistor having a gate connected to the first node, a first electrode connected to the first clock signal terminal, and a second electrode connected to the signal output terminal; and a second capacitor connected between the first node and the signal output terminal.

4. The shift register circuit of claim 1, wherein the first reset circuit comprises:

a fourth transistor having a gate connected to the reset signal terminal, a first electrode connected to the first reference voltage terminal, and a second electrode connected to the signal output terminal; and a seventh transistor having a gate connected to the reset signal terminal, a first electrode connected to the first reference voltage terminal, and a second electrode connected to the first node.

5. The shift register circuit of claim 1, wherein the set circuit comprises a sixth transistor having a gate and a first electrode that are connected to the signal input terminal, and a second electrode connected to the first node.

6. The shift register circuit according to claim 1, further comprising:

a second control circuit configured to transfer the first reference voltage from the first reference voltage terminal to a third node to set the third node at an inactive potential in response to the first node being at the active potential, and to transfer a second clock signal from a second clock signal terminal to the third node to set the third node at an active potential in response to the second clock signal being active and the first node being at the inactive potential; and a second reset circuit configured to transfer the first reference voltage from the first reference voltage terminal to the first node to set the first node at an inactive potential in response to the third node being at the active potential, and to transfer the first reference voltage from the first reference voltage terminal to the signal output terminal in response to the third node being at the active potential.

7. The shift register circuit of claim 6, wherein the second control circuit comprises:

a ninth transistor having a gate and a first electrode that are connected to the second clock signal terminal, and a second electrode;

a tenth transistor having a gate connected to the second electrode of the ninth transistor, a first electrode connected to the second clock signal terminal, and a second electrode connected to the third node;

an eleventh transistor having a gate connected to the first node, a first electrode connected to the first reference voltage terminal, and a second electrode connected to the second electrode of the ninth transistor; and a twelfth transistor having a gate connected to the first node, a first electrode connected to the first reference voltage terminal, and a second electrode connected to the third node.

8. The shift register circuit of claim 6, wherein the second reset circuit comprises:

a fifth transistor having a gate connected to the third node, a first electrode connected to the first reference voltage terminal, and a second electrode connected to the signal output terminal; and an eighth transistor having a gate connected to the third node, a first electrode connected to the first reference voltage terminal, and a second electrode connected to the first node.

9. A gate drive circuit comprising a plurality of cascaded shift register circuits as claimed in claim 1, wherein:

except for a first one of the shift register circuits and a last one of the shift register circuits, the signal output terminal of each of the shift register circuits is connected to both the signal input terminal of an adjacent next one of the shift register circuits and the reset signal terminal of an adjacent previous one of the shift register circuits;

the signal output terminal of the first shift register circuit is connected to the signal input terminal of a second one of the stage shift register circuits; and the signal output terminal of the last shift register circuit is connected to the reset signal terminal of an adjacent previous one of the shift register circuits.

10. A display panel comprising the gate drive circuit of claim 9.

11. A display device comprising the display panel of claim 10.

12. A method of driving the shift register circuit of claim 1, the method comprising:

in a first phase, responsive to the input pulse from the signal input terminal being active, transferring the input pulse to the first node to set the first node at the active potential, and responsive to the first node being at the active potential, transferring the first clock signal from the first clock signal terminal to the signal output terminal;

in a second phase, responsive to the first clock signal transferred to the signal output terminal being active, changing the active potential at the first node further away from the inactive potential, and responsive to the first clock signal transferred to the signal output terminal being active, restricting a change in the active potential at the first node based on the second reference voltage from the second reference voltage terminal, the second reference voltage having a magnitude between a magnitude of the active input pulse and the inactive potential; and in a third phase, responsive to the reset pulse from the reset signal terminal being active, transferring the first reference voltage from the first reference voltage terminal to the first node to set the first node at an inactive potential, and responsive to the reset pulse from the reset signal terminal being active, transferring the first reference voltage from the first reference voltage terminal to the signal output terminal.

13. The method of claim 12, further comprising:

in the first and second phases, responsive to the first node being at the active potential, transferring the first reference voltage from the first reference voltage terminal to a third node to set the third node at an inactive potential; and in the third phase, responsive to a second clock signal from a second clock signal terminal being active and the first node being at the inactive potential, transferring the second clock signal to the third node to set the third node at an active potential.

14. The method of claim 13, further comprising:

in the third stage, responsive to the third node being at the active potential, transferring the first reference voltage from the first reference voltage terminal to the first node to set the first node at an inactive potential, and responsive to the third node being at the active potential, transferring the first reference voltage from the first reference voltage terminal to the signal output terminal.

15. The gate drive circuit of claim 9, wherein the first control circuit comprises:

a first transistor having a gate and a first electrode that are connected to the signal input terminal, and a second electrode connected to a second node;

a second transistor having a gate connected to the signal output terminal, a first electrode connected to the second reference voltage terminal, and a second electrode connected to the second node; and a first capacitor connected between the second node and the first node.

16. The gate drive circuit of claim 9, wherein the output circuit comprises:

a third transistor having a gate connected to the first node, a first electrode connected to the first clock signal terminal, and a second electrode connected to the signal output terminal; and a second capacitor connected between the first node and the signal output terminal.

17. The gate drive circuit of claim 9, wherein the first reset circuit comprises:

a fourth transistor having a gate connected to the reset signal terminal, a first electrode connected to the first reference voltage terminal, and a second electrode connected to the signal output terminal; and a seventh transistor having a gate connected to the reset signal terminal, a first electrode connected to the first reference voltage terminal, and a second electrode connected to the first node.

18. The gate drive circuit of claim 9, wherein the set circuit comprises a sixth transistor having a gate and a first electrode that are connected to the signal input terminal, and a second electrode connected to the first node.

19. The gate drive circuit of claim 9, further comprising:

a second control circuit configured to transfer the first reference voltage from the first reference voltage terminal to a third node to set the third node at an inactive potential in response to the first node being at the active potential, and to transfer a second clock signal from a second clock signal terminal to the third node to set the third node at an active potential in response to the second clock signal being active and the first node being at the inactive potential; and a second reset circuit configured to transfer the first reference voltage from the first reference voltage terminal to the first node to set the first node at an inactive potential in response to the third node being at the active potential, and to transfer the first reference voltage from the first reference voltage terminal to the signal output terminal in response to the third node being at the active potential.

20. The gate drive circuit of claim 19, wherein the second control circuit comprises:

a ninth transistor having a gate and a first electrode that are connected to the second clock signal terminal, and a second electrode;

a tenth transistor having a gate connected to the second electrode of the ninth transistor, a first electrode connected to the second clock signal terminal, and a second electrode connected to the third node;

an eleventh transistor having a gate connected to the first node, a first electrode connected to the first reference voltage terminal, and a second electrode connected to the second electrode of the ninth transistor; and a twelfth transistor having a gate connected to the first node, a first electrode connected to the first reference voltage terminal, and a second electrode connected to the third node.

* * * * *